(12) United States Patent
Ikeda et al.

(10) Patent No.: US 10,555,428 B2
(45) Date of Patent: Feb. 4, 2020

(54) BOARD UNIT

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Jun Ikeda, Mie (JP); Munsoku O, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/302,839

(22) PCT Filed: May 10, 2017

(86) PCT No.: PCT/JP2017/017766
§ 371 (c)(1),
(2) Date: Nov. 19, 2018

(87) PCT Pub. No.: WO2017/199822
PCT Pub. Date: Nov. 23, 2017

(65) Prior Publication Data
US 2019/0208658 A1 Jul. 4, 2019

(30) Foreign Application Priority Data
May 20, 2016 (JP) ................................ 2016-101732

(51) Int. Cl.
*H05K 1/00* (2006.01)
*H05K 1/18* (2006.01)
(Continued)

(52) U.S. Cl.
CPC ............. *H05K 5/06* (2013.01); *H01R 12/721* (2013.01)

(58) Field of Classification Search
CPC ...... H01R 12/71; H01R 12/721; H01R 13/52; H05K 5/0047; H05K 5/0069; H05K 5/06; H05K 5/069
See application file for complete search history.

(56) References Cited

U.S. PATENT DOCUMENTS 6,971,888 B2 * 12/2005 Takeuchi ............... H02G 3/088
439/76.2
7,893,364 B2 * 2/2011 Oda ....................... H05K 7/026
174/50
(Continued)

FOREIGN PATENT DOCUMENTS

JP 2014-116504 A 6/2014
JP 2015-211145 A 11/2015

OTHER PUBLICATIONS

International Search Report for Application No. PCT/JP2017/017766, dated Aug. 15, 2017.

*Primary Examiner* — Yuriy Semenenko
(74) *Attorney, Agent, or Firm* — Honigman LLP

(57) ABSTRACT

The present disclosure provides a board unit including a circuit board, a connector portion mounted on the circuit board, and a case housing the circuit board. The case includes a lower case having an upper opening; an upper cover covers the upper opening, and an opening portion is formed in a side wall of the case, through which the connector portion extends inside and outside the side wall. The upper cover includes an inner circumferential surface that forms at least a portion of the opening portion and a predetermined gap with an outer circumferential surface of the connector portion. A groove portion is formed continuously along the inner circumferential surface, is open in the (Continued)

inner circumferential surface and is in communication with the gap. A size of the gap and a size of the groove portion are configured to form a water film by water droplets entering the case.

2 Claims, 3 Drawing Sheets

(51) Int. Cl.
    *H05K 7/00*           (2006.01)
    *H05K 5/06*           (2006.01)
    *H01R 12/72*          (2011.01)

(56) References Cited

U.S. PATENT DOCUMENTS

| | | | |
|---|---|---|---|
| 9,924,606 B2* | 3/2018 | Tsubouchi | H01B 7/0045 |
| 10,090,657 B2* | 10/2018 | Kobayashi | H02G 3/081 |
| 2005/0153583 A1* | 7/2005 | Kawamura | H01R 9/2458 439/76.2 |
| 2007/0215614 A1* | 9/2007 | Matsui | H02G 3/088 220/3.2 |
| 2008/0158823 A1* | 7/2008 | Tominaga | B60R 16/0239 361/709 |
| 2009/0253027 A1* | 10/2009 | Yang | H01M 2/1072 429/61 |
| 2009/0280688 A1* | 11/2009 | Kawada | H01Q 1/1271 439/620.01 |
| 2012/0001525 A1 | 1/2012 | Ogatsu | |
| 2013/0141889 A1* | 6/2013 | Tsuchiya | E02F 9/0858 361/821 |
| 2014/0041891 A1* | 2/2014 | Kim | H05K 5/06 174/50.5 |
| 2014/0085839 A1* | 3/2014 | Nakano | H05K 5/0052 361/752 |

* cited by examiner

40: 42, 44
42: 42a, 42b
46: 420, 440

BOARD UNIT

CROSS-REFERENCE TO RELATED APPLICATIONS

This application is the U.S. national stage of PCT/JP2017/017766 filed May 10, 2017, which claims priority of Japanese Patent Application No. JP 2016-101732 filed May 20, 2016.

TECHNICAL FIELD

The present disclosure relates to a board unit.

BACKGROUND

As disclosed in JP 2014-175365A, a vehicle-mounted case or the like in which an electric device is housed is equipped with a waterproof structure for preventing failure of the housed electric device caused by water entering the case.

SUMMARY

A board unit according to the present disclosure is a board unit including a circuit board and a connector portion that is mounted on the circuit board. A case houses the circuit board. The case includes a lower case that has an upper opening. An upper cover covers the upper opening of the lower case and an opening portion that is formed in a side wall of the case through which the connector portion extends inside and outside the side wall. The upper cover includes an inner circumferential surface that is provided so as to form at least a portion of the opening portion and form a predetermined gap with an outer circumferential surface of the connector portion; and a groove portion that is formed continuously along the inner circumferential surface, and is open in the inner circumferential surface and is in communication with the gap, and a size of the gap and a size of the groove portion are set such that a water film is formed in the gap by water droplets entering the case from outside in a state where the groove portion is full of water.

DETAILED DESCRIPTION OF PREFERRED EMBODIMENTS

Technical Problem

Figure 1:
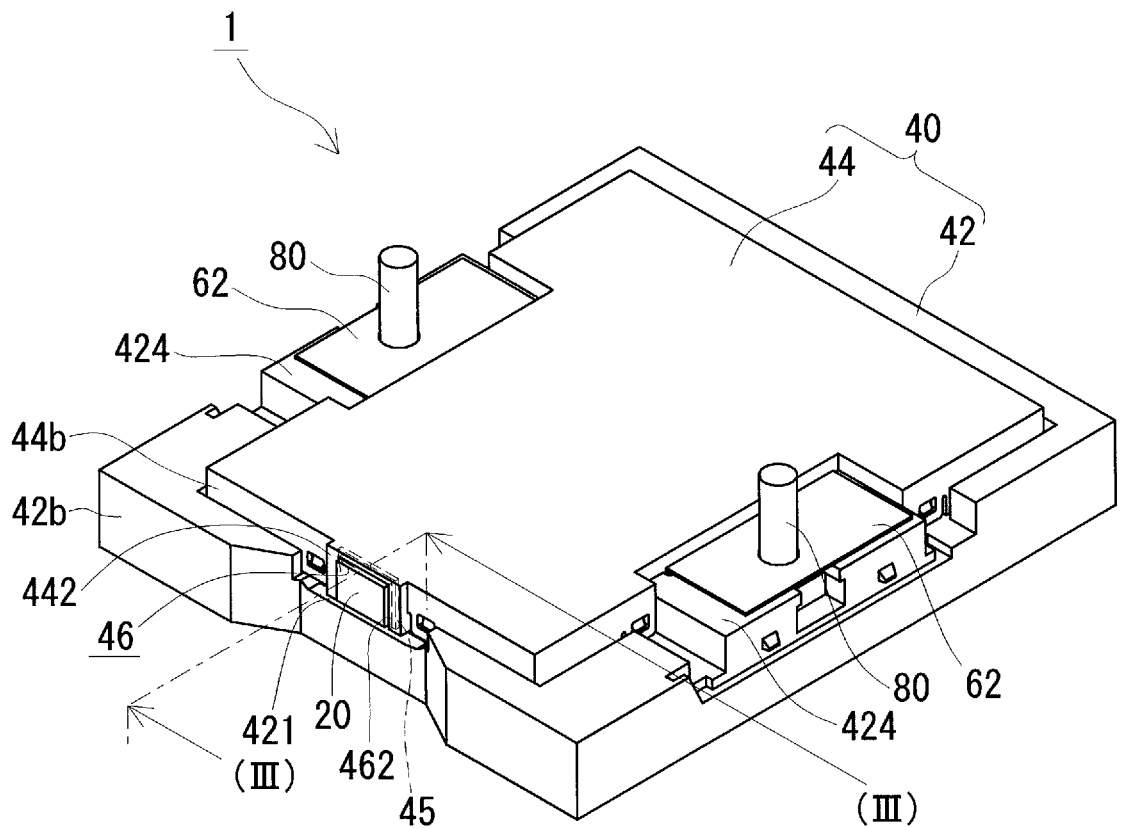
FIG. 1 is a schematic perspective view of a board unit according to Embodiment 1.

The configuration disclosed in JP 2014-175365A in which the case is hermetically sealed by a seal member increases the production cost.

Accordingly, it is an object of the present disclosure to provide a board unit that can keep water from entering the housing space by using a simple configuration.

Advantageous Effects of Disclosure

The board unit according to the present disclosure can keep water from entering the housing space by using a simple configuration.

First, an aspect according to the present disclosure is given and described. A board unit according to an embodiment of the present disclosure is a board unit including: a circuit board; a connector portion that is mounted on the circuit board; and a case that houses the circuit board, wherein the case includes: a lower case that has an upper opening; an upper cover that covers the upper opening of the lower case; and an opening portion that is formed in a side wall of the case, and through which the connector portion extends inside and outside the side wall, the upper cover includes: an inner circumferential surface that is provided so as to form at least a portion of the opening portion and form a predetermined gap with an outer circumferential surface of the connector portion; and a groove portion that is formed continuously along the inner circumferential surface, and is open in the inner circumferential surface and is in communication with the gap, and a size of the gap and a size of the groove portion are set such that a water film is formed in the gap by water droplets entering the case from outside in a state where the groove portion is full of water.

As used herein, the term "size of the gap" encompasses a width when viewed in a direction in which the connector portion is inserted.

The term "size of the groove portion" encompasses a cross sectional area.

In the board unit described above, the size of the gap and the size of the groove portion are set to specific sizes so that a water film forms in the gap as described above and the pressure acting in the circumferential direction of the groove portion, caused by the surface tension of water, increases to be greater than the pressure acting in a direction in which water flows toward the inside of the case. With this configuration, excess water is expelled via the groove portion.

Hereinafter, a more detailed description will be presented.

If water enters the case of the board unit, the circuit board may be damaged. For example, if water falling from above the board unit collides with the board unit and the like and scatters as water droplets, the water droplets may enter the case. In the case of a configuration in which an opening for the connector portion is provided in the side wall of the case, and the connector portion is provided by being inserted so as to extend inward and outward of the case via the opening portion, water droplets that have collided with the portion of the connector portion that protrudes from the opening portion to the outside of the case and have scattered may enter the case from any position in the gap between the opening portion and the connector portion. In the board unit described above, the gap between the opening portion for the connector portion and the connector portion, and the groove portion formed in the perimeter of the opening portion in the upper cover are configured to have specific sizes. Accordingly, when the groove portion is full of water attempting to enter the case from the gap, a water film can be automatically formed in the gap. The water film can be used as a water-stopping film by utilizing the above-described pressure relationship. New water droplets entering the gap are absorbed by the water film, and excess water (an amount of water that exceeds the capacity of the groove portion)

produced from absorption can be expelled from the opening portion of the groove portion via the gap that is in communication with the groove portion as needed. As described above, it is possible to maintain a state in which the water film is present by expelling excess water while forming a water film with water entering from the opening portion for the connector portion. If no water enters the gap, the water in the groove portion is expelled from the groove portion via the gap, and a state in which there is no water in the groove portion and the gap can be attained. The board unit described above can keep water from entering the housing space in which the circuit board is housed, by using a simple configuration in which a specific groove portion is formed in the perimeter of the opening portion of the upper cover through which the connector portion is inserted, and the opening portion is configured to have a specific size. Also, with the board unit described above, it is unnecessary to separately provide a seal member, and thus the board unit also has excellent assembling workability.

As an example of the board unit, the board unit may be configured such that an upper recess portion that forms a portion of the opening portion and surrounds an upper side of the outer circumferential surface of the connector portion is formed in a side wall portion of the upper cover, a lower recess portion that forms another portion of the opening portion and surrounds a lower side of the outer circumferential surface of the connector portion is formed in a side wall portion of the lower case, and the groove portion is formed in the inner circumferential surface that forms the upper recess portion.

With this configuration, the specific groove portion is formed so as to surround the upper recess portion of the upper cover, and it is therefore possible to keep, in addition to the above-described scattered water droplets, water attempting to enter from above the board unit into the housing space, in which the circuit board is housed, along the connector portion.

Hereinafter, a board unit according to an embodiment of the present disclosure will be described in detail with reference to the drawings. In the diagrams, the same reference numerals indicate the same structural elements.

Embodiment 1

A board unit 1 according to Embodiment 1 will be described with reference to FIGS. 1 to 5.

Figure 5:
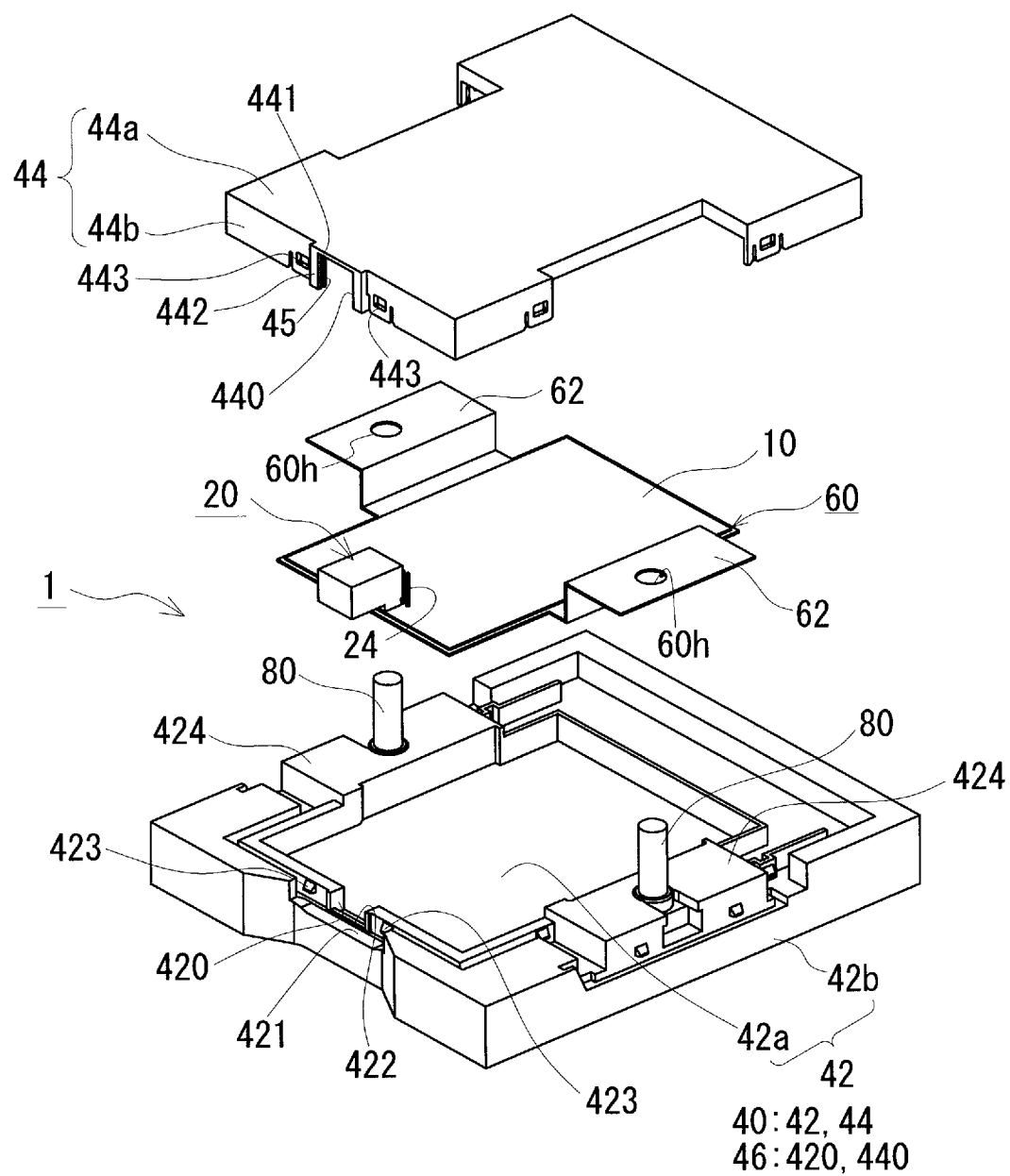
FIG. 5 is a schematic exploded perspective view of the board unit according to Embodiment 1.

As shown in FIG. 5, the board unit 1 includes a circuit board 10, a connector portion 20 that is mounted on the circuit board 10, and a case 40 that houses the circuit board 10. The case 40 includes a lower case 42 that has an upper opening, an upper cover 44 that covers the upper opening of the lower case 42, and an opening portion 46 that is formed in a side wall of the case 40. The connector portion 20 is inserted so as to extend inward and outward of the side wall of the case 40 via the opening portion 46 (FIG. 1). One feature of the board unit 1 according to Embodiment 1 is that a waterproof structure for keeping water from entering the case 40 from the opening portion 46 is provided in a side wall of the case 40. In short, the waterproof structure includes a groove portion 45 that is formed in the upper cover 44 at a location where the opening portion 46 is formed, and a gap 462 between the opening portion 46 and the connector portion 20 and the groove portion 45 are configured to have specific sizes so that a water film is formed in the gap 462 by water attempting to enter the case 40 from the opening portion 46 as a water-stopping film.

Hereinafter, the constituent elements will be described with reference primarily to FIG. 5. After that, the waterproof structure will be described in detail with reference primarily to FIGS. 2 and 3. In the description given below, in the board unit 1, the side on which the lower case 42 of the case 40 is provided is defined as the "lower" side, and the side on which the upper cover 44 is provided is defined as the "upper" side. Also, the side in a direction perpendicular to the up-down direction of the case 40 and on which the connector portion 20 is provided is defined as the "front" side, and the opposite side is defined as the "rear" side.

Circuit Board

The circuit board 10 is a substantially rectangular printed circuit board on which a conductive pattern (not shown) is formed. A conductive path formed in the conductive pattern is used as, for example, a control conductive path (a portion of a circuit). Electronic components (not shown) such as a switching element and the connector portion 20 are mounted on the circuit board 10. FIG. 5 shows, as an example, a unitary body in which the circuit board 10 is disposed on a bus bar 60 that constitutes an electric power circuit, and the circuit board 10 and the bus bar 60 are fixed to each other with an insulating adhesive, adhesive sheet, or the like. In this example, the bus bar 60 includes a main body portion that supports the circuit board 10, and extension portions 62 that extend from the main body portion. An external device is electrically connected to the extension portions 62.

Connector Portion

The connector portion 20 is a connection member that electrically connects the circuit board 10 and an external control apparatus or the like. The connector portion 20 includes a connector terminal 24 that is electrically connected to a conductive path of the circuit board 10 through soldering or the like, and a housing that protects the connector terminal 24 and the like. FIG. 5 shows, as an example, a configuration in which the connector portion 20 is attached to a front side edge portion of the circuit board 10, and the connector terminal 24 extends from a rear region of the housing that is housed in the case 40. A mating connector portion (not shown) such as a connector portion of an external control apparatus is connected to a front region (FIG. 1) of the housing that protrudes outside of the case 40.

Case

In this example, the case 40 is a relatively shallow box-shaped container in which a housing space for housing the circuit board 10 is formed by combining a box-shaped lower case 42 that has an upper opening and a box-shaped upper cover 44 that covers the upper opening of the lower case 42. By combining the lower case 42 and the upper cover 44, a side wall portion 42b of the lower case 42 and a side wall portion 44b of the upper cover 44 overlap and form a side wall of the case 40, and an opening portion 46 for the connector portion 20 to be inserted into so as to extend inward and outward of the case 40 is formed in the side wall (FIG. 1). In this example, an upper recess portion 440 that forms a portion of the opening portion 46 and surrounds the upper side of an outer circumferential surface of the connector portion 20 is formed in the side wall portion 44b of the upper cover 44, and a lower recess portion 420 that forms another portion of the opening portion 46 and surrounds the lower side of the outer circumferential surface of the connector portion 20 is formed in the side wall portion 42b of the lower case 42. The opening portion 46 is a tubular space surrounded by the lower recess portion 420 and the upper recess portion 440. The connector portion 20 is interposed between the lower recess portion 420 and the upper recess portion 440, and positioned with respect to the case 40.

Lower Case

In this example, the lower case 42 has a rectangular box shape that includes a flat plate-like bottom portion 42a that forms a bottom surface of the case 40, and a frame-like side wall portion 42b that is provided so as to stand upright from a circumferential edge of the bottom portion 42a, and has an opening on a side (upper side) opposite to the bottom portion 42a. The bottom portion 42a and the side wall portion 42b may be unitarily molded into a molded article, or may be independent members that are not unitarily molded, or may be unitarily formed into an assembly by using fixing members such as bolts. In the case where the bottom portion 42a and the side wall portion 42b are formed into an assembly, the bottom portion 42a and the side wall portion 42b may be made of the same material, or may be made different materials.

The circuit board 10 (here, the circuit board 10 is formed as a unitary body with the bus bar 60) is placed on the bottom portion 42a. In this example, the bottom portion 42a has a rectangular shape that is slightly larger than that of the circuit board 10, and functions as a heat sink that dissipates heat generated from the electronic components mounted on the circuit board 10. As the bottom portion 42a that functions as a heat sink, it is possible to use, for example, a highly heat-conductive metal plate made of aluminum, copper, alloys thereof, or the like that has been subjected to insulation coating.

The side wall portion 42b is provided so as to surround the outer circumference of the circuit board 10. In this example, the side wall portion 42b is a rectangular frame that is continuous over the entire circumference of the bottom portion 42a. Also, in this example, the side wall portion 42b includes an inner wall that surrounds four sides of the circuit board 10, an outer wall that partially surrounds a front region and a rear region of the inner wall, and platform portions 424 that are interposed between the front and rear regions. A front region and a rear region of the side wall portion 44b of the upper cover 44 are inserted into a small gap formed between the inner wall and the outer wall that form a double structure (FIG. 1). The platform portions 424 support the extension portions 62 of the bus bar 60.

A cut-out that is open upward is formed in a center portion of the front region of the side wall portion 42b. In this example, a rectangular cut-out is made in both the inner wall portion and the outer wall, and the cut-out formed in the inner wall corresponds to the lower recess portion 420. An inner circumferential surface that forms the lower recess portion 420 forms a portion of the opening portion 46, and surrounds a lower region and lateral side regions of the connector portion 20.

Figure 2:
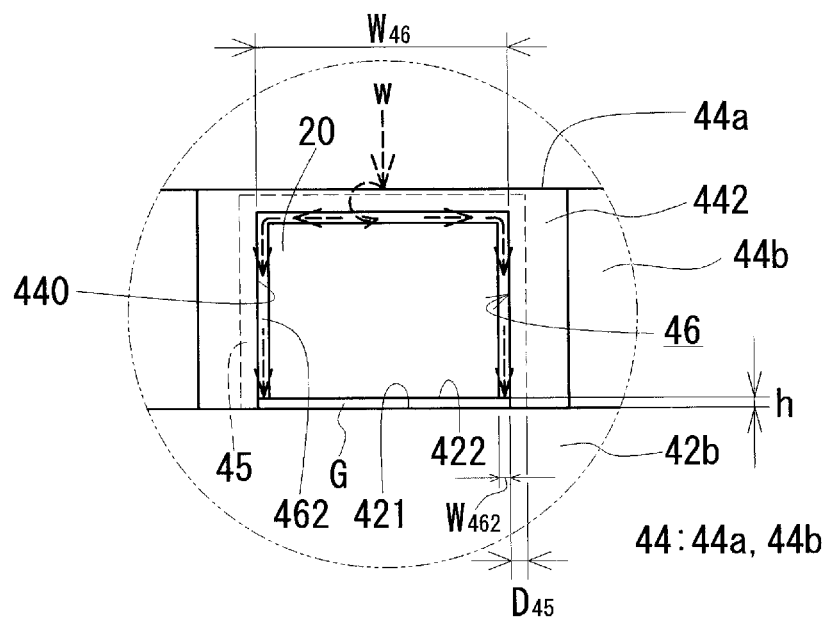
FIG. 2 is a schematic front view partially showing the vicinity of an upper recess portion of an upper cover of the board unit according to Embodiment 1.
Figure 3:
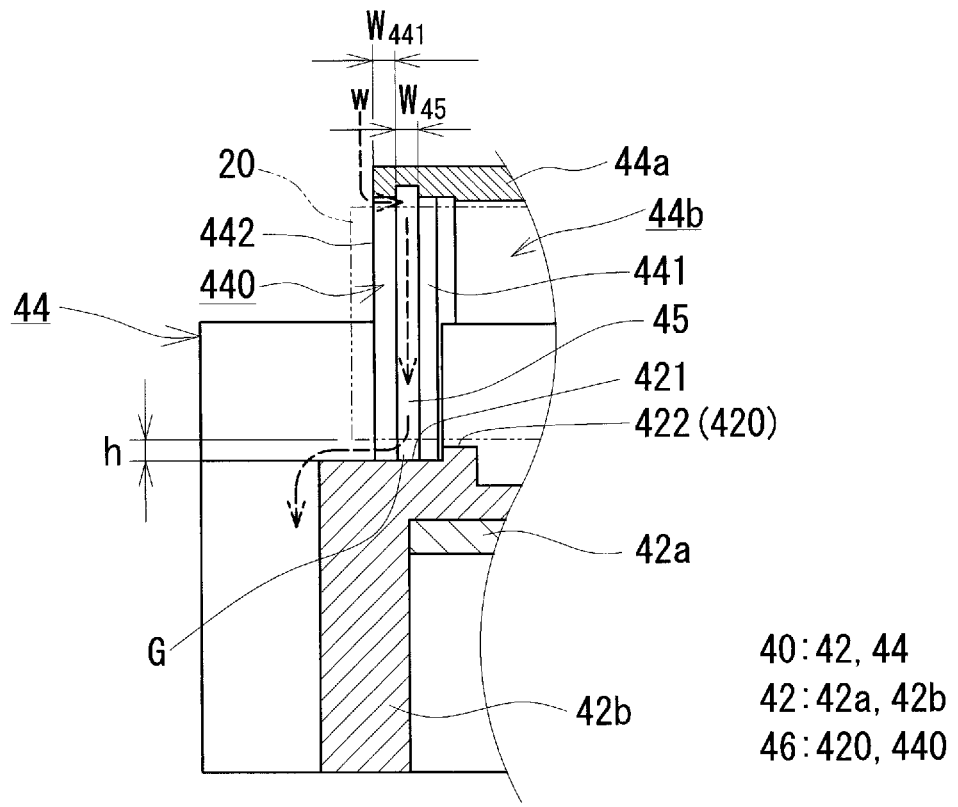
FIG. 3 is a partial cross sectional view showing the vicinity of a connector portion of the board unit according to Embodiment 1, taken along the line (III)-(III) shown in FIG. 1.

In this example, cut-outs are made in the inner wall and the outer wall so that an inner bottom surface 422, which is located on the lower side of the inner circumferential surface of the lower recess portion 420, is located higher than an outer bottom surface 421, which is located on the lower side of the inner circumferential surface of the cut-out formed in the outer wall (see also FIGS. 2 and 3). When the connector portion 20 is disposed on the lower recess portion 420, a gap G that has a height h is formed between the lower surface of the connector portion 20 and the outer bottom surface 421 of the outer wall (ditto). A lower end surface of a protruding portion 442, which will be described later, of the upper cover 44 abuts against the outer bottom surface 421 (ditto), and the protruding portion 442 is located forward of a protruding portion that includes the inner bottom surface 422 that is located higher than the outer bottom surface 421 (FIG. 3). With the protruding portion, the intrusion distance over which water flows from the groove portion 45 toward the circuit board 10 can be increased.

In addition to the above, in this example, an engagement portion (an engaging projection 423, in this example) for fixing the side wall portion 44b of the upper cover 44 is provided at an appropriate position on the inner wall of the side wall portion 42b (for example, both sides of the lower recess portion 420 in the front region, or the like). A male screw portion 80 is attached to each platform portion 424 so as to protrude upward from a center portion of the upper surface. The circuit board 10 is automatically positioned to a predetermined position in the lower case 42 by inserting a male screw portion 80 into a through hole 60h formed in each extension portion 62 of the bus bar 60, with the extension portions 62 being supported by the platform portions 424.

The lower case 42 and the upper cover 44, which will be described later, are made of, for example, a synthetic resin such as polypropylene (PP) or polyamide (PA).

Upper Cover

The upper cover 44 includes an inner circumferential surface that is provided so as to form at least a portion of the opening portion 46 and form a predetermined gap 462 with the outer circumferential surface of the connector portion 20 (FIGS. 1 and 2). In addition, the upper cover 44 includes a groove portion 45 that is formed continuously along the inner circumferential surface described above, and is open in the inner circumferential surface and in communication with the gap 462. In this example, the upper cover 44 includes the upper recess portion 440 that forms a portion of the opening portion 46, and the groove portion 45 is provided in an inner circumferential surface 441 that constitutes the upper recess portion 440 (see also FIGS. 3 and 4). One feature of the board unit 1 according to Embodiment 1 is that the size of the gap 462 and the size of the groove portion 45 are set such that a water film is formed in the gap 462 by water droplets entering the case 40 from the outside in a state where the groove portion 45 is full of water. As described above, by forming a water film in the gap 462 so as to increase the pressure acting in the circumferential direction of the groove portion 45, caused by the surface tension of water, to be greater than the pressure acting in a direction in which water flows toward the inside of the case 40, the water film acts as a water-stopping film, and excess water is expelled via the groove portion 45.

In this example, the upper cover 44 has a rectangular box shape unitarily formed by a flat plate-like roof portion 44a that forms an upper surface of the case 40 and a frame-like side wall portion 44b that is provided standing from a circumferential edge of the roof portion 44a, as shown in FIG. 5 and other diagrams. The upper cover 44 is formed so as to have a shape that corresponds to the shape of the opening of the lower case 42. In this example, the upper cover 44 is shaped so as to be capable of covering the opening portion in the inner wall and the opening portion in the outer wall of the lower case 42, with the platform portions 424 of the lower case 42 being exposed (see also FIG. 1). In the side wall portion 44b, engagement portions (engagement holes 443 in this example) are formed at positions corresponding to the engagement portions (the engaging projections 423 in this example) of the lower case 42. When a portion of the side wall portion 44b of the upper cover 44 is inserted into the double structured portion of the side wall portion 42b of the lower case 42, and the engagement portions are engaged, the upper cover 44 and the lower case 42 are unitarily fixed to each other, and the circuit board 10 is housed so as to not be exposed to the outside of the case 40 (FIG. 1).

Upper Recess Portion

A cut-out that is open downward is formed in a center portion of the front region of the side wall portion 44b. The cut-out corresponds to the upper recess portion 440. The inner circumferential surface 441 that forms the upper recess portion 440 forms a portion of the opening portion 46, and surrounds the upper and lateral side regions of the connector portion 20. In this example, the side wall portion 44b includes, in the front region, the gate-like protruding portion 442 in which the surrounding region of the upper recess portion 440 protrudes forward past the other regions. The groove portion 45 is formed in the protruding portion 442.

The shape and size of the lower recess portion 420 and the upper recess portion 440 that form the opening portion 46 are typically set according to the shape and size of the connector portion 20, within a range in which the connector portion 20 can be inserted and positioned with respect to the case 40, while giving appropriate consideration to an assembly margin. In the board unit 1 according to Embodiment 1, the size of the gap 462 and the size of the groove portion 45 including a manufacturing gap as described above are set to specific sizes, details of which will be described later.

The upper recess portion 440 has a shape that conforms to the outer shape of the connector portion 20. In this example, the upper recess portion 440 has a rectangular gate-like shape that surrounds the upper and lateral side regions of the connector portion 20 having a rectangular parallelepiped shape. Also, in this example, the shape and size of the upper recess portion 440 are adjusted such that the gap 462 between the inner circumferential surface 441 of the upper recess portion 440 and the outer circumferential surface of the connector portion 20 has a uniform width $W_{462}$ when viewed in the circumferential direction of the inner circumferential surface 441 (FIG. 2). The width $W_{462}$ of the gap 462 refers to the distance between the inner circumferential surface 441 of the upper recess portion 440 and the outer circumferential surface of the connector portion 20. When the width is uniform, it is easy to adjust the size of the groove portion 45, and the shape of the groove portion 45 can also be easily made into a simple shape. As long as it is possible to form a water film, which will be described later, the upper recess portion 440 may have a shape that is different from the outer shape of the connector portion 20, and the width $W_{462}$ may be partially different when viewed in the circumferential direction of the inner circumferential surface 441.

Groove Portion

Figure 4:
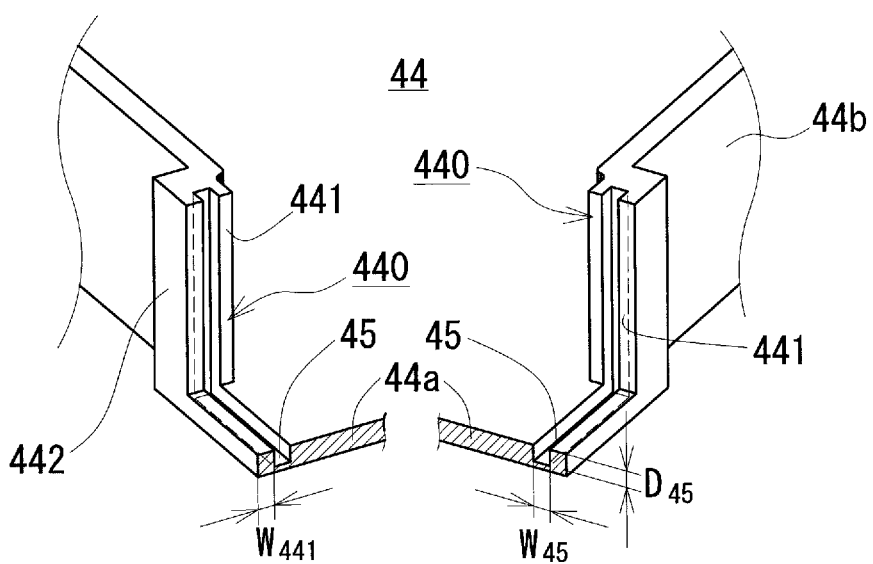
FIG. 4 is a diagram partially illustrating a groove portion, taken by cutting the vicinity of the upper recess portion while the upper cover of the board unit according to Embodiment 1 is placed with its opening facing upward.

In this example, the groove portion 45 (indicated by a dotted line in FIG. 2 and FIG. 4) is formed within the protruding portion 442 so as to have a gate-like shape that is continuous along the upper recess portion 440, and the groove portion 45 is open in the inner circumferential surface 441 of the upper recess portion 440 and is also open in a lower end surface (upper side in FIG. 4). The opening portion in the lower end surface is substantially closed as a result of the lower end surface of the protruding portion 442 abutting against the outer bottom surface 421 of the lower case 42. FIGS. 3 and 4 show, as an example, a groove portion 45 that has a rectangular cross sectional shape. The cross sectional shape of the groove portion 45 can be changed as appropriate, and may be, for example, a U shape in which the groove bottom surface is curved instead of being flat.

The groove portion 45 is open in the inner circumferential surface 441 of the upper recess portion 440, and thereby forms a space that is in communication with the gap 462. The space is used to form a water film and expel water, which will be described later.

The size of the groove portion 45, specifically the groove width $W_{45}$ (FIGS. 3 and 4), the groove depth $D_{45}$ (FIGS. 2 and 4), the cross sectional area, a circumferential length that extends along the circumferential direction of the inner circumferential surface 441 of the upper recess portion 440, the volume of the groove portion 45, and the like can be set according to the size of the gap 462. Particularly, in order to automatically form a water film in the gap 462 so as to increase the pressure acting in the circumferential direction of the groove portion 45, caused by the surface tension of water, to be greater than the pressure acting in a direction in which water flows toward the inside of the case 40 and expel excess water via the groove portion 45, the width $W_{462}$ of the gap 462, the cross sectional area of the groove portion 45, the width $W_{441}$ of the inner circumferential surface 441 extending from a circumferential edge that forms the opening portion 46 to the groove portion 45 (FIGS. 3 and 4), the width $W_{46}$ of the opening portion 46 extending along the upper surface of the connector portion 20 (FIG. 2), and the like may be adjusted. In this example, the size of the groove portion 45 is adjusted such that the groove width $W_{45}$ and the groove depth $D_{45}$ are uniform when viewed in the circumferential direction of the inner circumferential surface 441. The cross sectional area can be represented as a product of the groove width $W_{45}$ and the groove depth $D_{45}$, and thus, in this example, the cross sectional area of the groove portion 45 is also uniform.

The size of the gap 462 includes the width $W_{462}$, the width $W_{441}$ of the inner circumferential surface, the width $W_{46}$ of the opening portion 46, the circumferential length L that extends along the circumferential direction of the inner circumferential surface 441 of the upper recess portion 440, an area represented as a product of the width the $W_{462}$ and the circumferential length L, and the like. The size of the groove portion 45 includes the groove width $W_{45}$, the groove depth $D_{45}$, the cross sectional area, the circumferential length, the volume, and the like described above. As in this example, in the case where the width $W_{462}$ of the gap 462, the groove width $W_{45}$ and the groove depth $D_{45}$ of the groove portion 45, and the cross sectional area are uniform when viewed in the circumferential direction of the inner circumferential surface 441, the circumferential length of the groove portion 45 is obtained by using the width $W_{462}$ and the circumferential length L of the gap 462 and the groove depth $D_{45}$ of the groove portion 45, and the volume of the groove portion 45 is obtained as a product of the cross sectional area of the groove portion 45 and the circumferential length of the groove portion 45. In the case where the width $W_{462}$ of the gap 462 and the cross sectional area of the groove portion 45 are uniform as described above, adjusting the width $W_{462}$ of the gap 462 and the cross sectional area of the groove portion 45 makes it possible to substantially adjust at least one of the other sizes.

Waterproof Structure

Next, the waterproof structure of the board unit 1 will be described. In FIGS. 2 and 3, thick dotted arrows indicate the flow of water w.

Water w falling from above the board unit 1 collides with the upper surface of the case 40, particularly, the protruding portion 442 of the upper cover 44, the connector portion 20 that protrudes from the opening portion 46, and the like and scatters. Because the gap 462 is present between the outer circumferential surface of the connector portion 20 and the inner circumferential surface of the opening portion 46 (the inner circumferential surface 441 that forms the upper recess portion 440 of the upper cover 44 in this example), the scattered water droplets may enter from any position of the gap 462 at any angle in the depth direction of the gap 462 (the right-left direction in FIG. 3), and flow into the case 40. Because the gap 462 has a certain depth dimension (width $W_{441}$ or the like), the water droplets that have entered the gap 462 come into contact with any of the outer circumferential surface of the connector portion 20, the inner circumferential surface 441 of the upper recess portion 440, and the inner circumferential surface of the groove portion 45 while flowing to the groove portion 45, and accumulate in the gap 462 or the groove portion 45. Water that exceeds the capacity of the groove portion 45 is discharged, following the groove portion 45, from the opening portion on the lower side of the groove portion 45 to the lower region of the gap 462, flows from the gap 462 along the outer bottom surface 421 of the side wall portion 42b via the gap G, and is expelled to the outside of the case 40. During the process from when the water w enters the gap 462 and to when the water w is expelled, a water film is automatically formed in the gap 462 utilizing the surface tension of the water that has entered the gap 462. In the case where scattered water droplets continuously enter the gap 462, the water film absorbs new water droplets, and old water in the groove portion 45 is expelled in an amount corresponding to the absorbed amount. Even if water droplets that exceed the capacity of the groove portion 45 attempt to enter the gap 462, excess water droplets are expelled, and it is therefore possible to maintain a state in which the water film is present. If no water enters from the gap 462, all of the water in the groove portion 45 is expelled (including drying). The water film can be formed repeatedly by new water droplets entering the gap 462.

Applications

The board unit 1 according to the present embodiment can be used in a high current power control unit mounted on a vehicle (an automobile or the like) such as, for example, a direct current voltage converter, an AC/DC converter, or a DC/AC inverter.

Advantageous Effects

With the board unit 1 according to Embodiment 1, a water film that functions as a water-stopping film can be automatically formed in the gap 462 between the opening portion 46 for the connector portion 20, which is formed in a side wall of the case 40, and the connector portion 20. Accordingly, it is possible to keep water from entering the housing space of the case 40 in which the circuit board 10 is housed. In addition, the waterproof structure that uses the water film described above can be constructed with a simple configuration in which a specific groove portion 45 is formed at a location where the opening portion 46 is formed, and the gap 462 and the groove portion 45 are configured to have specific sizes. Accordingly, the board unit 1 also has excellent productivity. Particularly, in this example, the board unit 1 includes the groove portion 45 in the upper recess portion 440 that forms a portion of the opening portion 46 for the connector portion 20 in the upper cover 44, and it is therefore possible to keep not only water droplets that have collided with the connector portion 20 and the case 40 and scattered, but also water that has fallen from above the board unit 1 and flowed to the connector portion 20, from entering the housing space.

Test Example 1

For the board unit 1 according to Embodiment 1, protection against water entering the case 40 was tested by setting the width $W_{462}$ of the gap 462 between the connector portion 20 and the opening portion 46 of the case 40, and the cross sectional area of the groove portion 45 formed in the upper recess portion 440 that forms a portion of the opening portion 46 in the upper cover 44 to specific values.

The test was performed in accordance with Degree of Protection (IP code) 2 stipulated in JIS C 0920 (2003). In this test example, a waterproof test was performed 10 times. Also, the connector portion was configured to have a rectangular parallelepiped shape, and the gap between the connector portion and the inner circumferential surface of the upper recess portion of the upper cover was a gate-like gap formed between three sides of the outer circumferential surface of the connector portion having a rectangular parallelepiped shape and the gate-like inner circumferential surface forming the upper recess portion. The width of the gap was uniform when viewed in the circumferential direction of the gate-like inner circumferential surface. The groove portion was a gate-like groove portion extending along the gate-like inner circumferential surface. The groove depth and the groove width were uniform when viewed in the circumferential direction of the gate-like inner circumferential surface.

Sample No. 1 in which the gap width $W_{462}$ was set to 0.5 mm and the cross sectional area of the groove portion was set to 1 mm$^2$ (groove depth $D_{45}$: 1 mm, and groove width $W_{45}$: 1 mm) was subjected to a waterproof test 10 times, but no water entered the case. It was confirmed, from this fact, that it is possible to prevent water from entering the case by appropriately adjusting the size of the gap and the size of the groove portion.

The present disclosure is not limited to the examples given above. The scope of the present disclosure is indicated by the appended claims, and all changes that come within the meaning and range of equivalency of the claims are intended to be embraced within the scope of the present disclosure. It is possible to change, for example, the size of the gap (width, circumferential length, and the like), the size of the groove portion (groove width, groove depth, cross sectional area, circumferential length, and volume), the shape of the groove portion, the shape and size of the location where the opening portion for the connector portion is formed in the upper cover (the width of the inner circumferential surface, the width of the opening portion, and the like described above), and the like.

The invention claimed is:
1. A board unit comprising:
   a circuit board;
   a connector portion that is mounted on the circuit board; and
   a case that houses the circuit board,
   wherein the case includes:
      a lower case that has an upper opening;
      an upper cover that covers the upper opening of the lower case;
      and
      an opening portion that is formed in a side wall of the case, and through which the connector portion extends inside and outside the side wall,
   the upper cover includes:
      an inner circumferential surface that is provided so as to form at least a portion of the opening portion and form a predetermined gap with an outer circumferential surface of the connector portion; and
      a groove portion that is formed continuously along the inner circumferential surface, and is open in the inner circumferential surface and is in communication with the gap, and a size of the gap and a size of the groove portion are set such that a water film is formed in the gap by water droplets entering the case from outside in a state where the groove portion is full of water.

2. The board unit according to claim 1,
wherein an upper recess portion that forms a portion of the opening portion and surrounds an upper side of the outer circumferential surface of the connector portion is formed in a side wall portion of the upper cover, a lower recess portion that forms another portion of the opening portion and surrounds a lower side of the outer circumferential surface of the connector portion is formed in a side wall portion of the lower case, and the groove portion is formed in the inner circumferential surface that forms the upper recess portion.

* * * * *